United States Patent [19]
Sanchez et al.

[11] Patent Number: 5,793,094
[45] Date of Patent: Aug. 11, 1998

[54] METHODS FOR FABRICATING ANTI-FUSE STRUCTURES

[75] Inventors: Ivan Sanchez, San Antonio; Yu-Pin Han, Dallas, both of Tex.; Ying-Tsong Loh, Saratoga, Calif.; Walter D. Parmantie, San Antonio, Tex.

[73] Assignee: VLSI Technology, Inc., San Jose, Calif.

[21] Appl. No.: 579,780

[22] Filed: Dec. 28, 1995

[51] Int. Cl.$^6$ .................................................. H01L 29/00
[52] U.S. Cl. .................... 257/530; 257/50; 438/131; 438/467; 438/600
[58] Field of Search ................... 257/530, 50; 437/902; 438/131, 467, 600

[56] References Cited

U.S. PATENT DOCUMENTS

| | | | |
|---|---|---|---|
| 4,174,521 | 11/1979 | Neale | 357/45 |
| 4,420,766 | 12/1983 | Kasten | 357/59 |
| 4,441,167 | 4/1984 | Principi | 365/94 |
| 4,538,167 | 8/1985 | Yoshino et al. | 357/59 |
| 4,569,120 | 2/1986 | Stacy et al. | 29/574 |
| 5,070,384 | 12/1991 | McCollum et al. | 357/51 |
| 5,095,362 | 3/1992 | Roesner | 357/23.4 |
| 5,106,773 | 4/1992 | Chen et al. | 437/51 |
| 5,120,769 | 6/1992 | Boardman et al. | 437/195 |
| 5,191,241 | 3/1993 | McCollum et al. | 307/465 |
| 5,210,598 | 5/1993 | Nakazaki et al. | 257/530 |
| 5,233,206 | 8/1993 | Lee et al. | 257/50 |
| 5,248,632 | 9/1993 | Tung et al. | 437/195 |
| 5,258,891 | 11/1993 | Sako | 361/792 |
| 5,266,829 | 11/1993 | Hamdy et al. | 257/530 |
| 5,272,666 | 12/1993 | Tsang et al. | 365/96 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |

(List continued on next page.)

FOREIGN PATENT DOCUMENTS

| | | | |
|---|---|---|---|
| 83109609 | 10/1983 | China . | |
| 6-242678 | 4/1993 | China | G03G 15/08 |
| 162 529 A1 | 11/1985 | European Pat. Off. | H01L 29/32 |
| 3927033 A1 | 5/1989 | European Pat. Off. | H01L 45/00 |
| 452 091 A2 | 10/1991 | European Pat. Off. | H01L 23/525 |
| 0 455 414 | 11/1991 | European Pat. Off. | 257/530 |
| 483 958 A1 | 6/1992 | European Pat. Off. | H01L 23/525 |
| WO92/21154 | 11/1992 | European Pat. Off. | H01L 45/00 |
| WO93/05514 | 3/1993 | European Pat. Off. | G11C 17/16 |
| 592 077 A1 | 4/1994 | European Pat. Off. | H01L 23/525 |
| 57-117255 | 7/1982 | Japan | H01L 21/88 |
| WO92/20109 | 12/1992 | WIPO . | |
| WO 93/04499 | 3/1993 | WIPO | 257/530 |

OTHER PUBLICATIONS

Unknown, "*Developments in non–volatile FPGAs*", Electronic Engineering, Apr., 1993.

K.E. Gordon and R.J. Wong, "*Conducting Filament of the Programmed Metal Electrode Amorphous Silicon Antifuse*", QuickLogic Corp., Santa Clara, CA, 1993 IEEE, International Electron Devices Meeting, Dec. 5–8, 1993, Washington, DC.

*Primary Examiner*—J. Carroll
*Attorney, Agent, or Firm*—Hickman & Martine, LLP

[57] ABSTRACT

A method for substantially reducing variations in a programming voltage of an anti-fuse structure formed on an integrated circuit wafer. The anti-fuse structure has a metal-one layer, an anti-fuse layer disposed above the metal-one layer, a oxide layer disposed above the anti-fuse layer, and a via hole in the oxide layer through to the anti-fuse layer for receiving a deposition of a metal-two material. The method includes the step of rendering a selected anti-fuse area susceptible to fuse link formation by reducing a resistivity of the selected anti-fuse area to diffusion of atoms from one of the metal-one layer and the metal-two layer when a programming voltage is applied between the metal one layer and the metal two layer. The selected anti-fuse area is located in the anti-fuse layer and substantially adjacent to and outside of an anti-fuse area directly below the via hole. The method further includes the step of depositing the metal-two material into the via hole.

21 Claims, 5 Drawing Sheets

U.S. PATENT DOCUMENTS

| | | | |
|---|---|---|---|
| 5,300,456 | 4/1994 | Tigelaar et al. | 437/195 |
| 5,308,795 | 5/1994 | Hawley et al. | 437/195 |
| 5,311,039 | 5/1994 | Kimura et al. | 257/50 |
| 5,328,868 | 7/1994 | Conti et al. | 437/203 |
| 5,373,169 | 12/1994 | McCollum et al. | 257/50 |
| 5,381,035 | 1/1995 | Chen et al. | 257/530 |
| 5,404,029 | 4/1995 | Husher et al. | 257/50 |
| 5,427,979 | 6/1995 | Chang | 437/190 |
| 5,434,432 | 7/1995 | Spratt et al. | 257/50 |
| 5,464,790 | 11/1995 | Hawley | 437/60 |
| 5,489,796 | 2/1996 | Harward | 257/379 |
| 5,493,144 | 2/1996 | Bryant et al. | 257/529 |
| 5,493,146 | 2/1996 | Pramanik et al. | 257/530 |
| 5,502,315 | 3/1996 | Chuca et al. | 257/530 |
| 5,557,136 | 9/1996 | Gordon et al. | 257/530 |
| 5,593,920 | 1/1997 | Haslam et al. | 437/195 |

METHODS FOR FABRICATING ANTI-FUSE STRUCTURES

BACKGROUND OF THE INVENTION

The present invention relates generally to integrated circuit (IC) chips, particularly to integrated circuit chips that employ anti-fuse devices. More particularly, the present invention relates to improved methods and apparatus for fabricating anti-fuse devices having a more uniform programming voltage margin.

Fuse and anti-fuse structures have been used for sometime in certain classes of IC chips such as field programmable gate arrays, programmable read-only memories (PROMS) and the like. Field programmable gate arrays include a large number of logic elements, such as AND gates and OR gates, which can be selectively coupled together by means of fuses or anti-fuses to perform user designed functions. An unprogrammed fuse-type gate array is programmed by selectively blowing fuses within the device, while an unprogrammed anti-fuse type gate array is programmed by causing selected anti-fuses to become conductive.

There are many types of PROMS including standard, write-once PROMS, erasable programmable read-only memories (EPROMS), electrically erasable programmable read-only memories (EEPROMS), etc. A PROM usually comprises an array of memory cells arranged in rows and columns, which can be programmed to store user data.

Fuses for field programmable gate arrays, PROMS and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts D.C.) is applied to the fuse, the current flowing through the fuse will cause it to heat-up and will eventually melt the fuse at its neck, thereby "blowing" the fuse. Fuses in electronic devices are much more prevalent today than anti-fuses because they are easier to manufacture and have a better record of reliability.

Despite being less popular, anti-fuses do have the very desirable feature of being small in size. For example, a TiW fuse with a 2 micron neck and 6 micron end width permits approximately 4,000 fuses to be provided on a typical device. In contrast, a 1 or 1.2 micron diameter anti-fuse via permits 80,000–100,000 fuses to be provided on a single device. Therefore, anti-fuses have the potentiality of providing vastly greater numbers of interconnections or of storing much greater amounts of information than devices using fuse technology.

Anti-fuse structures include a material which initially has a high resistance but which can be converted into a low resistance material by the application of a programming voltage. Once programmed, these low resistance anti-fuse structures can couple together logic elements of a field programmable gate array so that the gate array will perform user-desired functions, or can serve as memory cells of a PROM. To facilitate further discussion, FIG. 1 schematically illustrates a cross section of a prior art anti-fuse structure 10. Anti-fuse structure 10 includes a metal-one layer 14, which is typically formed over an oxide layer of a semiconductor substrate, e.g., the silicon dioxide layer of a silicon wafer. Metal-one layer 14 typically comprises titanium-tungsten and/or other suitable conductive materials and may be formed by a conventional physical vapor deposition (PVD) process, such as sputtering. In some cases, metal-one layer 14 may be formed of a three-layer sandwich of titanium-tungsten/aluminum/titanium tungsten(TiW/Al/TiW), with the titanium-tungsten acting as a diffusion barrier to prevent aluminum atoms from diffusing into and degrading the subsequently deposited layer of anti-fuse material.

Above metal-one layer 14, there is disposed an anti-fuse layer 16. This anti-fuse layer 16 is formed of one of the known anti-fuse materials such as amorphous silicon (A-Si), which has an intrinsic resistivity of approximately 1 mega-ohms/cm, and may be deposited by any number of conventional processes, including chemical vapor deposition (CVD).

An inter-metal oxide layer 18, typically consisting of silicon dioxide, is then deposited above anti-fuse layer 16 also by one of the well-known processes, e.g., the above-mentioned chemical vapor deposition (CVD).

A via hole 20 is then etched, using a conventional photoresist technique and an appropriate etchant, in inter-metal oxide layer 18 through to anti-fuse layer 16. A metal-two layer 22 then fills via hole 20 to create a metal contact to anti-fuse layer 16 through inter-metal oxide layer 18. Like the metal-one layer, the metal-two layer may also comprise the aforementioned three-layer sandwich, titanium-tungsten and/or other suitable conductive materials, and may also be deposited by a physical vapor deposition process, e.g., sputtering.

Depending on the thickness and composition of anti-fuse layer 16, the anti-fuse structure of FIG. 1 may then be programmed by applying an appropriate programming voltage between metal-one layer 14 and metal-two layer 22. For a typical amorphous silicon-based anti-fuse, the programming voltage may be, for example, between about 10–12 volts D.C. at about 10 mA. By way of example, a typical amorphous silicon-based anti-fuse structure 10 may have a resistance of about 1–2 giga-ohms before programming (for a one micron diameter anti-fuse structure). After being programmed, the same anti-fuse structure 10 may have a resistance of about 20 to 100 ohms.

As is known, the programming voltage of an anti-fuse structure, such as anti-fuse structure 10, is a function of the thickness of its anti-fuse layer, e.g., anti-fuse layer 16 of FIG. 1, at the point where the conductive fuse link is formed. To maintain a constant programming voltage across anti-fuse structures in a single IC or a batch of IC's, the thickness of the anti-fuse layer at the point where the conductive fuse link is formed should be uniform.

It has been found, however, that the oxide etch step, which creates via hole 20, usually does not stop precisely at the interface between inter-metal oxide layer 18 and anti-fuse layer 16. This oxide etch step may, for example, remove about a few hundred angstroms of the anti-fuse material, e.g., amorphous silicon, before stopping. With reference to FIG. 1, the oxide etch step removes some of the anti-fuse material in anti-fuse layer 16, thereby creating a depression in the anti-fuse layer below via hole 20. This depression is indicated by reference numeral 50 in FIG. 1.

At this location, the thickness of anti-fuse layer 16 is non-uniform and is typically less than that of the surrounding anti-fuse region. When a programming voltage is applied between metal-one layer 14 and metal-two layer 42, the fuse link is likely to be formed at this depressed location. One such fuse link is shown in FIG. 1 as fuse link 52.

The removal of anti-fuse material during the via etch step introduces variations into the programming voltage of anti-fuse devices. As a result, the programming voltage may vary across anti-fuse structures within a single IC or in different IC's although the anti-fuse layer, e.g., anti-fuse layer 16 of FIG. 1, is substantially uniform when deposited, i.e., prior to the via etch step. The variations in the programming voltages introduce deprogrammed states and lead to what are commonly known as deprogrammed states and/or infant mortality failures, i.e., the anti-fuse fuse link is not properly formed when an appropriate programming voltage is applied, or, once formed, does not stay formed over time. These problems are exacerbated in modern high-density devices in which the anti-fuse structure may already be scaled with sub-micron or even smaller design rules. This is because the anti-fuse layer is already quite thin in those devices and there is little room for such programming voltage variations.

In view of the foregoing, what is desired is methods and apparatus for reducing programming voltage variations in anti-fuse devices.

SUMMARY OF THE INVENTION

The invention relates, in one embodiment, to a method for substantially reducing variations in a programming voltage of an anti-fuse structure formed on an integrated circuit wafer. The anti-fuse structure has a metal-one layer, an anti-fuse layer disposed above the metal-one layer, a oxide layer disposed above the anti-fuse layer, and a via hole in the oxide layer through to the anti-fuse layer for receiving a deposition of a metal-two material. The method includes the step of rendering a selected anti-fuse area susceptible to fuse link formation by reducing a resistivity of the selected anti-fuse area to diffusion of atoms from one of the metal-one layer and the metal-two layer when a programming voltage is applied between the metal one layer and the metal two layer. The selected anti-fuse area is located in the anti-fuse layer and substantially adjacent to and outside of an anti-fuse area directly below the via hole. There is further included the step of depositing the metal-two material into the via hole.

The invention relates, in another embodiment, to an anti-fuse structure on a semiconductor substrate. The anti-fuse structure includes a metal-one layer, and an anti-fuse layer disposed above the metal-one layer. The anti-fuse layer has a first resistance value when the anti-fuse structure is unprogrammed and a second resistance value lower than the first resistance value when the anti-fuse structure is programmed. The anti-fuse structure further includes an inter-metal oxide layer disposed above the anti-fuse layer. The inter-metal oxide layer has a via formed therein. There is further provided a potential linking area disposed in the anti-fuse layer adjacent to and outside of an anti-fuse area directly below the via hole. The potential linking area has a reduced resistance to a migration of atoms from one of the metal-one layer and the metal-two layer when a programming voltage is applied between the metal-one layer and the metal-two layer. Additionally, there is a provided a metal-two layer disposed above the inter-metal oxide layer, a portion of the metal-two layer being in electrical contact with the anti-fuse layer through the via in the inter-metal oxide layer.

These and other advantages of the present invention will become apparent upon reading the following detailed descriptions and studying the various figures of the drawings.

DETAILED DESCRIPTION OF THE PREFERRED EMBODIMENTS

Figure 1:
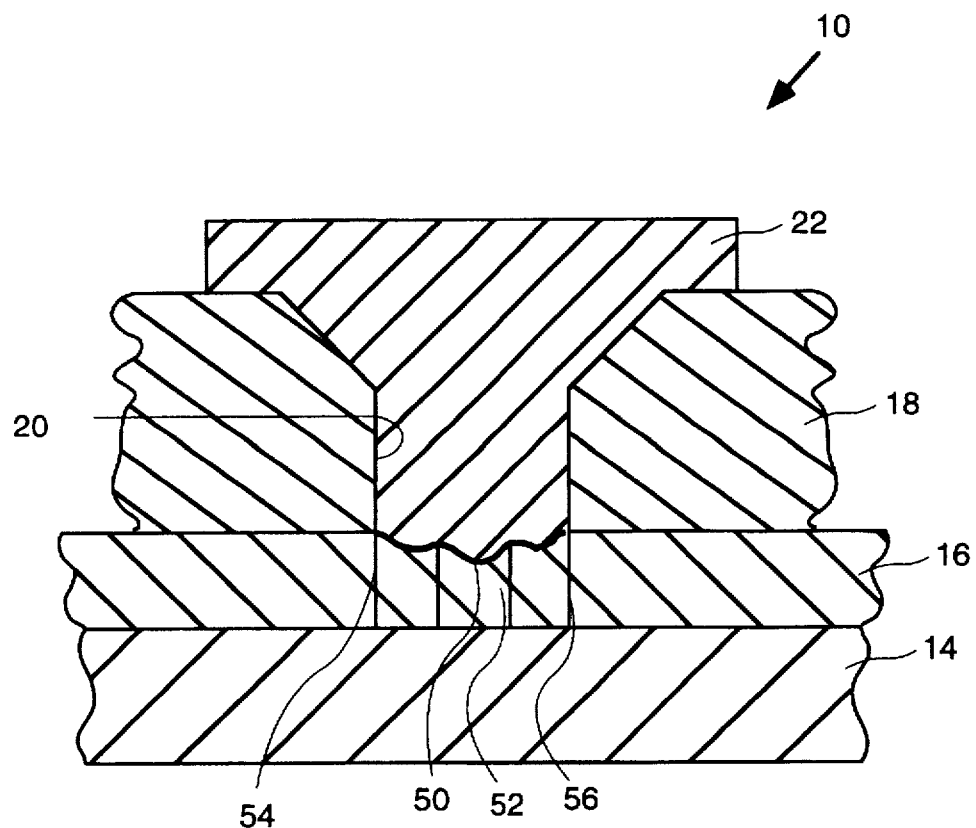
FIG. 1 schematically illustrates a cross section of a prior art anti-fuse structure.

FIG. 1 schematically illustrates a cross section of a prior art anti-fuse structure.

In accordance with one aspect of the present invention, the variations in the thickness of the anti-fuse layer where the fuse link is expected to form (and the concomitant variations in anti-fuse programming voltages) are substantially reduced by defining in advance the anti-fuse area in the anti-fuse layer where the fuse links are going to be formed (hereinafter "the potential linking areas"). More importantly, by designating the potential linking areas to coincide with areas in the anti-fuse layer where there is little thickness variation after the via etch step, the present invention advantageously substantially reduces the anti-fuse programming voltage variations.

To illustrate, consider the anti-fuse structure of prior art FIG. 1. The area in the anti-fuse layer 16 from which anti-fuse material is removed during the via etch step is typically confined to the area below via hole 20. In other words, variations in the thickness of the anti-fuse layer due to the via etch step is generally confined in each anti-fuse structure to the anti-fuse area directly below the via hole (shown bounded by lines 54 and 56 of FIG. 1).

If the anti-fuse layer is substantially uniform when deposited, its thickness outside of the area defined by lines 54 and 56 would also stay uniform after the via etch step irrespective of how much anti-fuse material is removed by the via-etch step. The present invention takes advantage of the fact that if the fuse link of every anti-fuse structure can be made to form in the anti-fuse layer area where there is little thickness variation after the via etch step, i.e., the anti-fuse layer area that is adjacent to and outside of the anti-fuse area directly below the via hole, programming voltage variations among anti-fuse structures can be substantially eliminated. By way of example, the anti-fuse area where, in accordance with one aspect of the present invention, the fuse link should be formed is the anti-fuse area outside of and adjacent to lines 54 and 56 in FIG. 1.

In one embodiment of the present invention, the aforementioned predefined potential linking area is created by rendering that area more susceptible to fuse link formation, i.e., making it easier for the atoms of the either the metal-one layer or the metal-two layer to diffuse through that area when a programming voltage is applied. Preferably, the potential linking area should have a lower resistance to the diffusion of atoms of the metal layers than either the anti-fuse area directly below the via hole or other areas of the anti-fuse layer.

Figure 2:
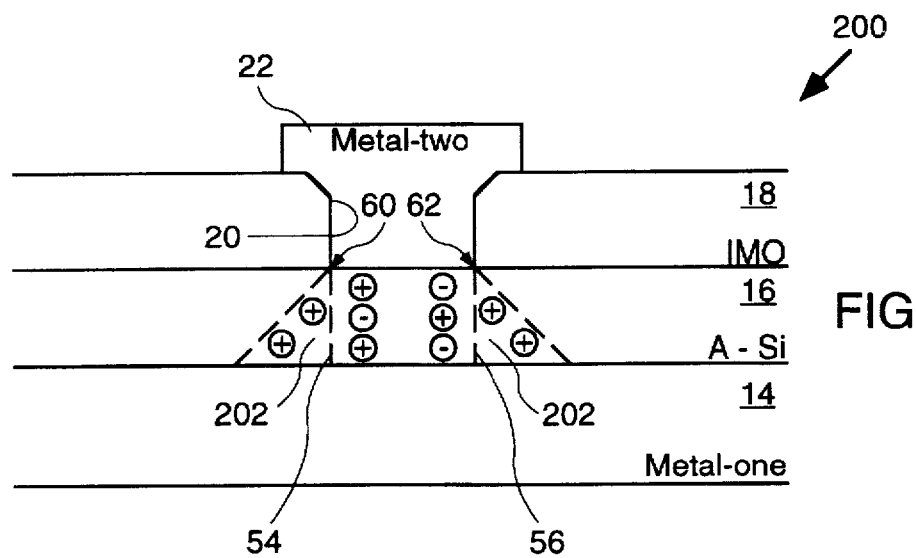
FIG. 2 illustrates, in one embodiment, the inventive anti-fuse structure, including the potential linking area.

With reference now to FIG. 2, there is shown in one embodiment an anti-fuse structure 200 that advantageously includes the inventive predefined potential linking areas. Anti-fuse structure 200 includes a metal-one layer 14, an anti-fuse layer 16, an inter-metal oxide layer 18, and a metal-two layer 22, which are arranged substantially as discussed earlier in connection with prior art FIG. 1. Via hole 20 is then etched through inter-metal oxide layer 18 using a conventional photoresist technique and an appropriate dopant. By way of example, one such photoresist technique involves the application of a resist material, the exposure of the resist in a contact or stepper lithography system, and the development of the resist to form a mask to facilitate subsequent etching.

The anti-fuse layer 16 is next doped or implanted through via hole 20 to render the potential linking area more susceptible to fuse link formation than other areas of the anti-fuse layer. Note that terms "doped" and "implanted" are used interchangeably herein and denote the process of introducing a dopant material into the anti-fuse layer through, e.g., ion implantation, chemical vapor deposition (CVD), which includes plasma-enhanced chemical vapor deposition (PECVD). In the embodiment of FIG. 2, an n-type dopant, e.g., phosphorous or another suitable dopant, is first implanted into the anti-fuse area below via hole 20, i.e., the anti-fuse area between lines 54 and 56 of FIG. 2. The implantation of n-type dopants is carried out conventionally with the dopant ions impacting the anti-fuse plane at about 90°, i.e., substantially orthogonal with the anti-fuse layer through via hole 20. In one example, the phosphorous dopants are implanted at an implantation energy of about 5E13 keV.

Thereafter, the anti-fuse layer is doped through via hole 20 with a p-type dopant, e.g., boron or another suitable dopant, at a tilted angle. In other words, the p-type dopants are now allowed to impact anti-fuse layer 16 through via hole 20 at an angle other than 90°, preferably at an angle of about 30° to about 60°, and more preferably at about 45° with the anti-fuse layer plane. As an example, an implantation of BF₃ at an implantation energy of about 5E13 keV at about 45° has been found to be suitable. In one embodiment, the tilted implant is accomplished by simply tilting the wafer at the desired angle during implantation. Thereafter, metal-two layer 22 is formed using a conventional process, e.g., physical vapor deposition or sputtering.

The implantation dosages of both the n-type implant and the tilted p-type implant are chosen such that the concentration of n-type dopants and p-type dopants are substantially equal in the anti-fuse area directly below via hole 20, i.e., the anti-fuse area bounded by lines 54 and 56. In this manner, the dopant imbalance, i.e., an excess of p-type dopants, exists only in a small anti-fuse area adjacent to and outside of the anti-fuse area directly below via hole 20. Because of the tilted implant step, the anti-fuse area where a dopant imbalance exists assumes a hollow conic shape. With reference to FIG. 2, the anti-fuse area where a dopant imbalance exists is shown as area 202.

The excess p-type dopants render area 202 more susceptible to fuse link formation because atoms, e.g., titanium-tungsten, such as those from the lower metal-one layer or the upper metal two layer, can more easily diffuse through this area when a programming voltage is applied. Consequently, the potential linking area is defined by this area 202, i.e., the area in the anti-fuse layer where a dopant imbalance exists. As shown in FIG. 2, this potential linking area is advantageously located adjacent to but outside of the anti-fuse area directly under via hole 20. Thus, this potential linking area is not significantly affected by the link etch step, which removes anti-fuse material primarily from the anti-fuse area directly under via hole 20. As mentioned earlier, when the anti-fuse fuse links are formed in areas in the anti-fuse layer where there is little thickness variation, the anti-fuse programming voltages may be uniformly maintained.

Note that potential linking areas 202 are advantageously located adjacent to corners 60 and 62 of metal-two plug 22. Since corners 60 and 62 represent the locations in the anti-fuse structure where the electric field lines are most localized when a programming voltage is applied, the adjacent location of potential linking areas 202 makes it even more likely that a fuse link will be formed there.

Figure 3A:
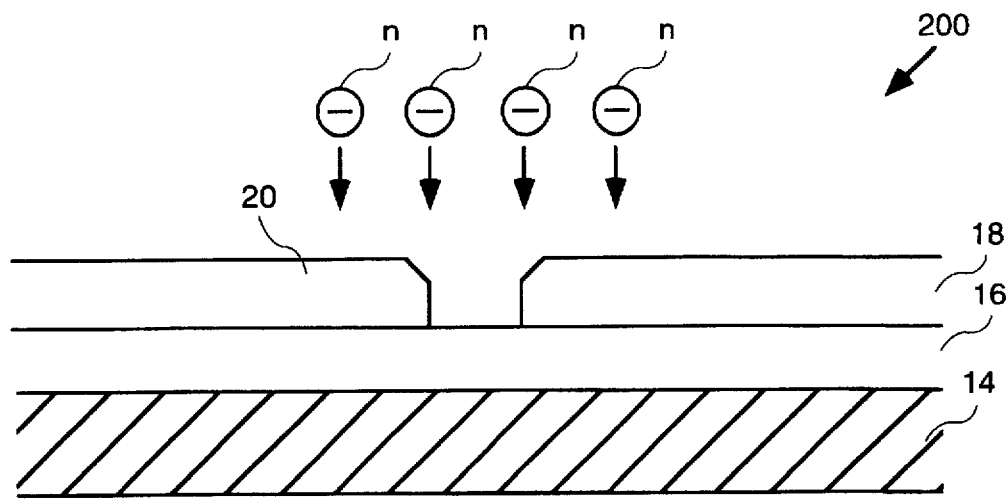
FIGS. 3A–3C diagramatically illustrate the steps involved in creating potential linking area FIG. 2.
Figure 3C:
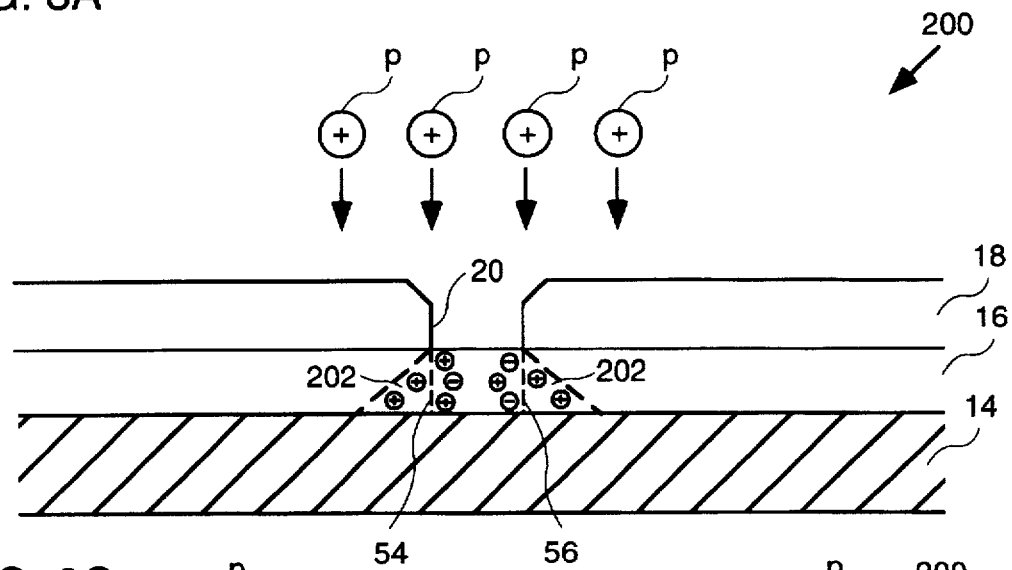
Figure 3B:
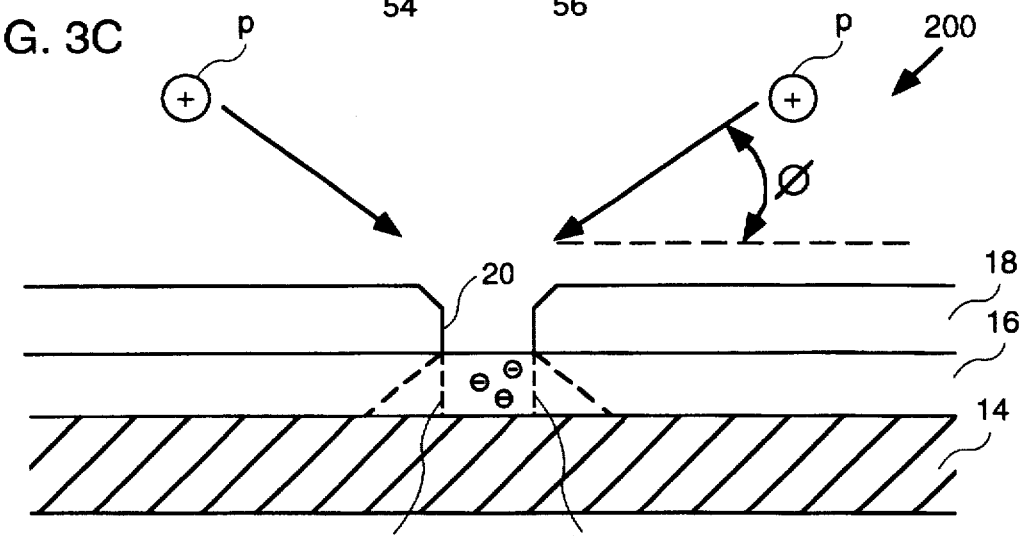

FIGS. 3A–3C diagramatically illustrate the steps involved in creating potential linking area 202 of FIG. 2. In FIG. 3A, the anti-fuse layer 18 is implanted with n-type dopants through via hole 20 in a conventional manner, thereby doping the anti-fuse area directly below via hole 20 with n-type dopants. In FIG. 3B, the anti-fuse layer is implanted with p-type dopants through via hole 20 at a tilted angle θ, representing the angle the dopant ions make with the anti-fuse layer plane during implantation. As mentioned earlier, this tilted angle θ is preferably about 30°–60°. Further, the implantation dosages in the steps of FIGS. 3A and 3B are such that the n-type and p-type dopant concentrations are substantially equal in the anti-fuse area directly below via hole 20, e.g., between lines 54 and 56 of FIG. 3B, thereby rendering this area substantially electrically neutral.

In FIG. 3C, there is shown an optional step of implanting p-type dopants vertically down to balance, if necessary, the n-type and p-type dopants in the aforementioned anti-fuse area directly below via hole 20. The step shown in FIG. 3C may be omitted if the n-type and p-type dopant concentrations are already substantially balanced following the tilted implantation of p-type dopants in FIG. 3B. Alternatively, the steps of FIG. 3B and FIG. 3C may be reversed.

Figure 4:
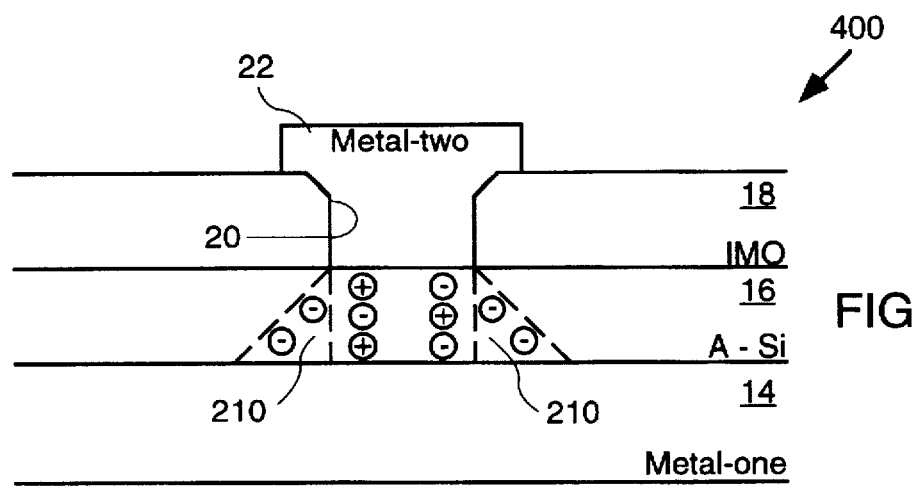
FIG. 4 illustrates an alternative embodiment for the anti-fuse structure of FIG. 2.

FIG. 4 illustrates an alternative embodiment for the anti-fuse structure shown in FIG. 2. In FIG. 4, the p-type dopant and the n-type dopant of FIG. 2 are reversed. Region 210, representing the potential linking area formed by a tilt-angle implant of n-type dopants, e.g., boron or another suitable dopant, is shown adjacent to and outside of the anti-fuse area directly below via hole 20. As mentioned earlier, this potential linking area represents the area where the fuse link of the anti-fuse structure is most likely to form when a programming voltage is in fact applied.

Figure 5:
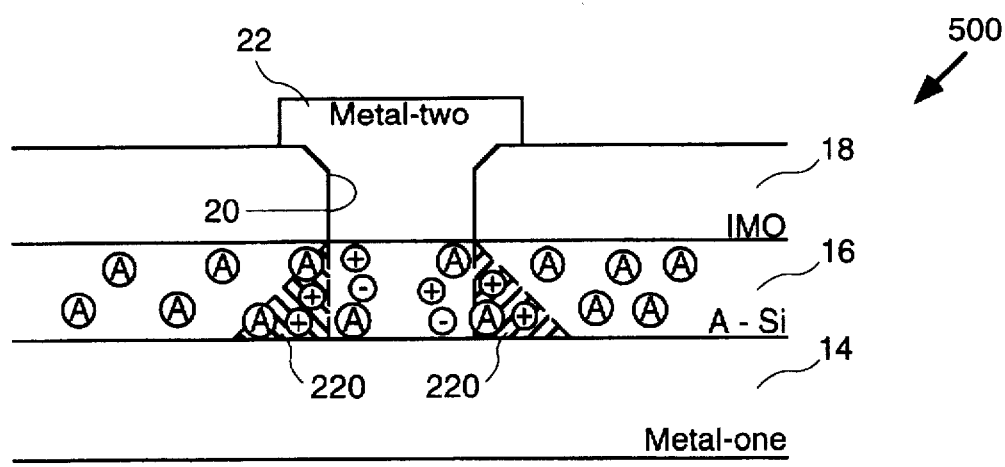
FIG. 5 illustrates yet another embodiment of the present invention wherein the anti-fuse layer is doped with an ion of a noble gas to render it more resistant to diffusion prior to the deposition of inter-metal oxide layer.

FIG. 5 illustrates yet another embodiment of the present invention wherein anti-fuse layer 16 is doped with an ion of a noble gas, such as argon, to render it more resistant to diffusion of the aforementioned metal atoms prior to the deposition of inter-metal oxide layer 18. In one example, argon is implanted at an implantation energy of about 5E15 keV. This doping step advantageously increases the programming voltage for a given anti-fuse layer thickness, thereby allowing anti-fuse device 300 of FIG. 5 to be scaled down and employed in higher density devices. The anti-fuse layer is then doped conventionally, e.g., vertically downward through via hole 20, with n-type dopants. In one example, phosphorous dopants are implanted at about the same implantation energy as that specified in FIG. 2. Thereafter, a tilted p-type dopant implantation, performed in a manner analogous to that discussed in connection with FIG. 2, is carried out to define a potential linking area adjacent to and outside of the anti-fuse area directly below via hole 20. It is found in one example that the implantation of $BF_3$ at about a 45° angle at an implantation energy of about 5E13 keV is suitable. The potential linking area is created where there are excess p-type dopants in the relatively diffusion resistant anti-fuse layer. With reference to FIG. 5, this area is shown as potential linking area 220, representing the area in the anti-fuse layer where the fuse link is most likely to form when a programming voltage is applied.

Figure 6:
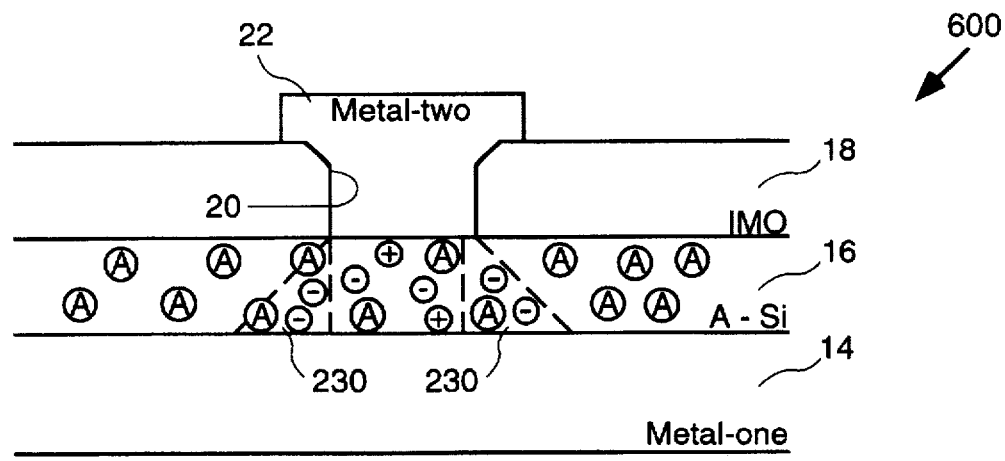
FIG. 6 illustrates an alternative embodiment for the anti-fuse structure of FIG. 5.

FIG. 6 illustrates an alternative embodiment for the anti-fuse structure shown in FIG. 5. In FIG. 6, the p-type dopant and the n-type dopant of FIG. 5 are reversed. Region 230, representing the potential linking area formed by a tilt-angle implant of n-type dopants is shown adjacent to and outside of the anti-fuse area directly below via hole 20. As mentioned earlier, this potential linking area represents the area where the fuse link of the anti-fuse structure is most likely to be formed in the presence of a programming voltage.

Figure 7:
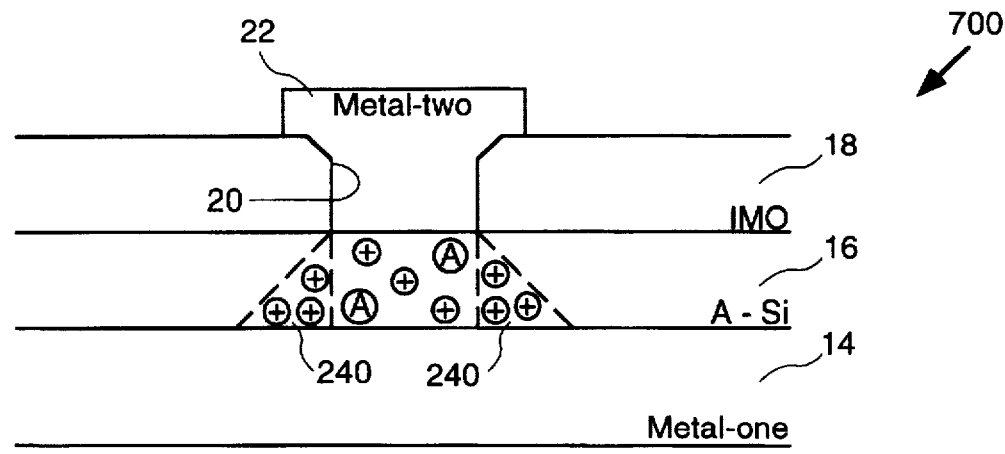
FIG. 7 illustrates another embodiment in which the anti-fuse structure region directly below the via hole is doped an ion of a noble gas through the via hole prior to the tilted implantation of dopants.

FIG. 7 illustrates an alternative embodiment in which the anti-fuse structure is not uniformly doped with an ion of a noble gas prior to the formation of the inter-metal oxide layer 18. Instead, anti-fuse structure 700 of FIG. 7 is doped with an ion of a noble gas, e.g., argon, through via hole 20 after via hole 20 is etched to render an anti-fuse region directly below via hole 20 more resistant to diffusion of atoms of either metal-one or metal-two layer. In one example, argon is implanted at an implantation energy of about 5E15 keV.

Subsequently, a tilted implant of p-type dopants, e.g., boron or another suitable dopant, is performed to create an anti-fuse region having an excess of p-type dopants. In one case, $BF_3$ is implanted at an angle of about 45° at an implantation energy of about 5E13 keV. Although this anti-fuse region may overlap the anti-fuse region directly below via hole 20, the potential linking region where a fuse link is likely to form in the presence of a programming voltage is located primarily outside of and adjacent to the anti-fuse region directly below via hole 20. This is because there is no implantation of noble gas ions, e.g., argon, in this area (shown in FIG. 7 as area 240), thereby making it less resistant to diffusion of metal atoms than either the anti-fuse region directly below via hole 20 (in which there exist implanted ions of a noble gas) or other regions where there are no p-type dopants implanted.

Figure 8:
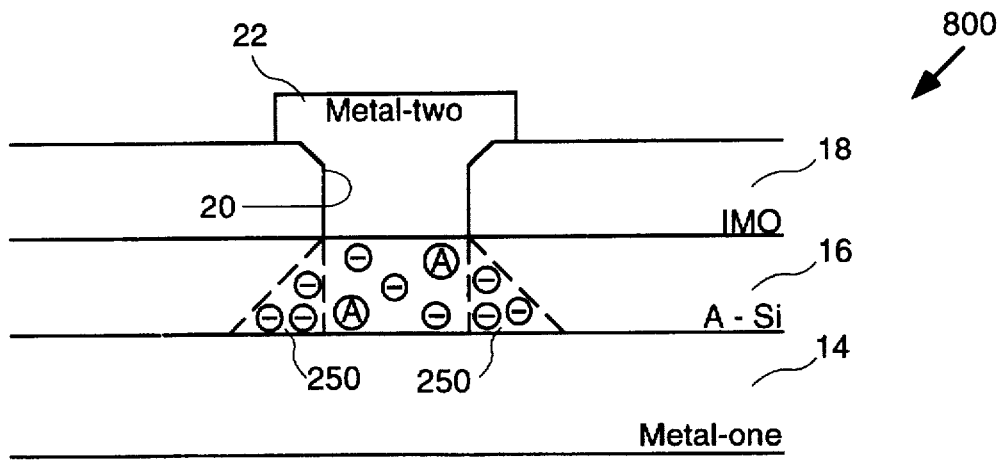
FIG. 8 illustrates an alternative embodiment for the anti-fuse structure of FIG. 7.

FIG. 8 illustrates an alternative embodiment for the anti-fuse structure shown in FIG. 7. In FIG. 8, however, n-type dopants, e.g., phosphorous or other suitable dopants, are used for the tilted implantation instead of p-type dopants as is done in the case of FIG. 7. In one case, phosphorous is implanted at an angle of about 45° at an implantation energy of about 5E13 keV. Region 250, representing the potential linking area formed by a tilted angle implant of n-type dopants is shown adjacent to and outside of the anti-fuse area directly below via hole 20. As mentioned earlier, this potential linking area represents the area where the fuse link of the anti-fuse structure is most likely to be formed in the presence of a programming voltage.

Figure 9:
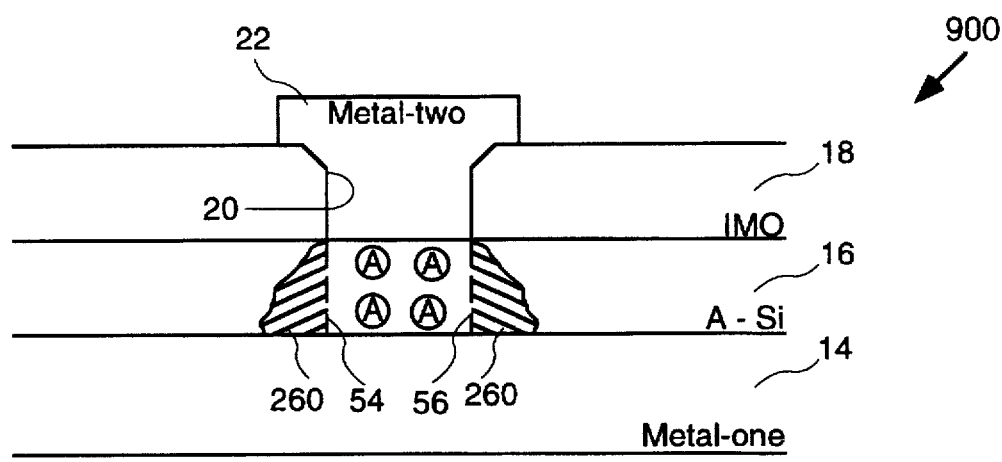
FIG. 9 shows, in one particularly advantageous embodiment of the present invention, an anti-fuse structure in which no tilted implantation of dopants is required.

FIG. 9 shows, in one particularly advantageous embodiment of the present invention, an anti-fuse structure 900 in which no tilted implant is required. In anti-fuse structure 900, metal-one layer 14, anti-fuse layer 16, and inter-metal oxide layer 18 are formed in a conventional manner. After via hole 20 is etched in inter-metal oxide layer 18 through to anti-fuse layer 16, the anti-fuse area directly below via hole 20, e.g., the area of the anti-fuse layer between lines 54 and 56 of FIG. 9, is rendered more resistant to the diffusion of atoms from the metal layers than other areas of the anti-fuse layer. In one embodiment, ions of a noble gas such as, e.g., argon, is implanted substantially vertically down toward anti-fuse layer 16 through via hole 20. In one specific example, argon is implanted at an implantation energy of about 5E15 keV through the via hole.

When a programming voltage is applied between metal-one layer 14 and metal-two layer 22, a fuse link is less likely to form through the more resistant anti-fuse area directly below via hole 20. The anti-fuse are directly below via hole 20 is preferably implanted with a sufficient dosage of noble gas ions to resist fuse link formation therethrough even if it is thinner due to the fact that some of the anti-fuse material is removed during the via etch step. The fuse link therefore will likely form in the anti-fuse areas outside of and adjacent to the diffusion resistant anti-fuse area, i.e., the anti-fuse area directly below via hole 20. Further, the fuse link will likely form in the anti-fuse areas adjacent to corners 60 and 62 of metal-two plug 22 due to the higher concentration of electric field lines when a programming voltage is applied. By way of example, FIG. 9 shows fuse-link 260 formed in the anti-fuse region outside of and adjacent to the diffusion resistant anti-fuse area directly below via hole 20. Because the fuse link is formed in an anti-fuse region that is not varied substantially by the via etch step, the programming voltage margins stay uniform across anti-fuse structures.

The resulting wafer containing the improved anti-fuse structures may then undergoes additional conventional processing steps to be processed into IC chips. The resulting IC chips may then be incorporated in an electronic device, e.g., any of the well known commercial or consumer electronic devices, or digital computers.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An anti-fuse structure on a semiconductor substrate, comprising:

a metal-one layer;

an anti-fuse layer disposed above said metal-one layer, said anti-fuse layer having a first resistance value when said anti-fuse structure is unprogrammed and a second resistance value lower than said first resistance value when said anti-fuse structure is programmed;

an inter-metal oxide layer disposed above said anti-fuse layer, said inter-metal oxide layer having a via formed therein;

a potential linking area disposed in said anti-fuse layer adjacent to and substantially outside of an anti-fuse area that substantially directly below said via; and a metal-two layer disposed above said inter-metal oxide layer a portion of said metal-two layer being in electrical contact with said anti-fuse layer through said via in said inter-metal oxide layer, wherein said potential linking area is doped so as to have a reduced resistance to a migration of atoms from one of said metal-one layer and said metal-two layer when a programming voltage is applied between said metal-one layer and said metal-two layer, wherein said anti-fuse area directly below said via hole is implanted through said via with an ion of a noble gas, thereby forming said potential linking area.

2. The anti-fuse structure of claim 1 wherein said noble gas is argon.

3. An anti-fuse structure on a semiconductor substrate, comprising:

a metal-one layer;

an anti-fuse layer disposed above said metal-one layer, said anti-fuse layer having a first resistance value when said anti-fuse structure is unprogrammed and a second resistance value lower than said first resistance value when said anti-fuse structure is programmed;

an inter-metal oxide layer disposed above said anti-fuse layer, said inter-metal oxide layer having a via formed therein;

a potential linking area disposed in said anti-fuse layer adjacent to and outside of an anti-fuse area directly below said via; and a metal-two layer disposed above said inter-metal oxide layer, a portion of said metal-two layer being in electrical contact with said anti-fuse layer through said via in said inter-metal oxide layer, wherein said potential linking area is doped so as to have a reduced resistance to a migration of atoms from one of said metal-one layer and said metal-two layer when a programming voltage is applied between said metal-one layer and said metal-two layer;

wherein said potential linking area is doped by performing a tilted implant through said via of an area in said anti-fuse layer that is adjacent to and outside of said anti-fuse area directly that is below said via hole.

4. The anti-fuse structure of claim 3 wherein said tilted implant comprises an implantation of a p-type dopant through said via of said area in said anti-fuse layer that is adjacent to and outside of an anti-fuse area directly below said via hole.

5. The anti-fuse structure of claim 4 wherein said anti-fuse area directly below said via hole is implanted through said via with an n-type dopant.

6. The anti-fuse structure of claim 4 wherein said anti-fuse area directly below said via hole is implanted through said via with an ion of a noble gas.

7. The anti-fuse structure of claim 3 wherein said tilted implant comprises an implantation of a n-type dopant through said via of said area in said anti-fuse layer that is adjacent to and outside of an anti-fuse area directly below said via hole.

8. The anti-fuse structure of claim 7 wherein said anti-fuse area directly below said via hole is implanted through said via with an p-type dopant.

9. The anti-fuse structure of claim 7 wherein said anti-fuse area directly below said via hole is implanted through said via with an ion of a noble gas.

10. The anti-fuse structure of claim 3 wherein said anti-fuse layer is doped with an ion of a noble gas prior to forming said inter-metal oxide layer.

11. The anti-fuse structure of claim 10 wherein noble gas is argon.

12. In an integrated circuit wafer, a method for substantially reducing variations in a programming voltage of an anti-fuse structure, said anti-fuse structure having a metal-one layer, an anti-fuse layer disposed above said metal-one layer, a oxide layer disposed above said anti-fuse layer, and a via hole in said oxide layer through to said anti-fuse layer for receiving a deposition of a metal-two material, comprising:

rendering a selected anti-fuse area susceptible to fuse link formation by reducing a resistivity of said selected anti-fuse area to diffusion of atoms from one of said metal-one layer and said metal-two layer when a programming voltage is applied between said metal one layer and said metal two layer, said selected anti-fuse area being located in said anti-fuse layer and substantially adjacent to and outside of an anti-fuse area directly below said via hole; wherein said rendering step comprises the steps of:

doping through said via hole said anti-fuse area directly below said via hole with a first dopant; and doping through said via hole and at a tilted angle with said integrated circuit wafer with a second dopant, whereby said selected anti-fuse area is rendered more susceptible to said fuse link formation than said anti-fuse area directly below said via hole and regions of said anti-fuse layer that are substantially undoped by either said first dopant or said second dopant; and depositing said metal-two material into said via hole.

13. The method of claim 1 wherein said anti-fuse layer comprises amorphous silicon and said one of said metal-one layer and said metal two layer comprises titanium-tungsten.

14. The method of claim 1 wherein said first dopant is an n-type dopant and said second dopant is a p-type dopant.

15. The method of claim 1 wherein said first dopant is a p-type dopant and said second dopant is an n-type dopant.

16. The method of claim 1 further comprising the step of doping, prior to forming said via hole in said oxide layer, said anti-fuse layer with ions of a noble gas to increase a resistivity of said anti-fuse layer to said diffusion of atoms from said one of said metal-one layer and said metal-two layer.

17. The method of claim 16 wherein said noble gas is argon.

18. The method of claim 1 wherein said first dopant is an ion of a noble gas and said second dopant is a p-type dopant.

19. The method of claim 1 wherein said first dopant is an ion of a noble gas and said second dopant is an n-type dopant.

20. The method of claim 1 wherein said tilted angle is about 30° to about 60°.

21. In an integrated circuit wafer, a method for substantially reducing variations in a programming voltage of an anti-fuse structure, said anti-fuse structure having a metal-one layer, an anti-fuse layer disposed above said metal-one layer, a oxide layer disposed above said anti-fuse layer, and a via hole in said oxide layer through to said anti-fuse layer for receiving a deposition of a metal-two material, comprising:

rendering a selected anti-fuse area susceptible to fuse link formation by increasing a resistivity of an anti-fuse area directly below said via hole to diffusion of atoms from one of said metal-one layer and said metal-two layer when a programming voltage is applied between said metal one layer and said metal two layer, said increasing includes doping said anti-fuse area directly below said via hole with a first dopant that comprises ions of a noble gas, said selected anti-fuse area being located in said anti-fuse layer and substantially adjacent to and substantially outside of said anti-fuse area directly below said via hole; and depositing said metal-two material into said via hole.

* * * * *